(12) United States Patent
Perminjat et al.

(10) Patent No.: US 11,974,419 B1
(45) Date of Patent: Apr. 30, 2024

(54) METHOD, SYSTEMS, AND APPARATUSES FOR ELECTROMAGNETIC SHIELDING

(71) Applicant: STMicroelectronics International N.V., Geneva (CH)

(72) Inventors: Florian Perminjat, Saint Romans (FR); Karine Saxod, Porte de Savoie (FR); Etienne Brosse, Sassenage (FR)

(*) Notice: Subject to any disclaimer, the term of this patent is extended or adjusted under 35 U.S.C. 154(b) by 0 days.

(21) Appl. No.: 18/209,018

(22) Filed: Jun. 13, 2023

(51) Int. Cl.
| | | |
|---|---|---|
| *H05K 9/00* | (2006.01) | |
| *H01L 23/552* | (2006.01) | |
| *H01L 31/167* | (2006.01) | |
| *H01L 23/60* | (2006.01) | |

(52) U.S. Cl.
CPC ......... *H05K 9/0058* (2013.01); *H01L 23/552* (2013.01); *H01L 31/167* (2013.01); *H05K 9/0084* (2013.01); *H05K 9/0088* (2013.01); *H01L 23/60* (2013.01)

(58) Field of Classification Search
CPC .... H01L 23/552; H01L 31/167; H05K 9/0058
See application file for complete search history.

(56) References Cited

U.S. PATENT DOCUMENTS

| | | | |
|---|---|---|---|
| 7,622,786 | B2 | 11/2009 | England |
| 8,896,743 | B2 | 11/2014 | Du et al. |
| 9,282,630 | B2 | 3/2016 | Merz |
| 2010/0006965 | A1 | 1/2010 | Shiung et al. |
| 2014/0043519 | A1 | 2/2014 | Azuma et al. |
| 2017/0127567 | A1* | 5/2017 | Besancon ............ H05K 1/0203 |
| 2017/0142871 | A1* | 5/2017 | Zhou ..................... H05K 9/0086 |
| 2018/0058920 | A1* | 3/2018 | Saxod ....................... H05K 1/18 |
| 2018/0166363 | A1* | 6/2018 | Heppner ............. H01L 25/0657 |
| 2018/0235075 | A1* | 8/2018 | Gaines ................. H05K 1/0218 |
| 2019/0103365 | A1* | 4/2019 | Singh ..................... H01L 23/552 |
| 2019/0139947 | A1* | 5/2019 | Saxod ................... B29C 69/001 |
| 2021/0123772 | A1* | 4/2021 | Pajkic ................... H01L 25/167 |
| 2021/0175180 | A1* | 6/2021 | Mischke ............... H01L 25/167 |

FOREIGN PATENT DOCUMENTS

| | | |
|---|---|---|
| CN | 109600914 | 4/2019 |
| KR | 102178923 | 11/2020 |

OTHER PUBLICATIONS

Petr Skočík, Martin Pospíšilík, Vojětch Křesálek, Milan Adámek; Indirect Measurement of Shielding Effectiveness of an Enclosure for a Security Camera; Measurement Science Review, 21, (2021), No. 1, 39-46.

* cited by examiner

Primary Examiner — Hung V Ngo
(74) Attorney, Agent, or Firm — ALSTON & BIRD LLP

(57) ABSTRACT

Methods, systems, and apparatuses for electromagnetic shielding are provided, particularly for semiconductor packages and/or printed circuit boards. For example, an optical device covered by an RF can may be attached to a substrate. The RF can may have a first aperture for an optical path of the optical device. A deposition layer may provide electromagnetic shielding in conjunction with the RF can. The deposition layer may include one or more portions that are deposited at the same time, including a first portion with an aperture that narrows the aperture of the RF can. The deposition layer, after being deposited, may be cured. The deposition layer and RF can may provide electromagnetic shielding for the optical device.

20 Claims, 7 Drawing Sheets

US 11,974,419 B1

METHOD, SYSTEMS, AND APPARATUSES FOR ELECTROMAGNETIC SHIELDING

TECHNOLOGICAL FIELD

Example embodiments of the present disclosure relate generally to electromagnetic shielding for semiconductor packages and/or printed circuit boards.

BACKGROUND

Semiconductor packages and/or components on printed circuit boards (PCB) may be exposed to electromagnetic interference (EMI) that may cause the semiconductor package and/or components on a PCB to malfunction or operate with reduced efficiency.

The inventors have identified numerous areas of improvement in the existing technologies and processes, which are the subjects of embodiments described herein. Through applied effort, ingenuity, and innovation, many of these deficiencies, challenges, and problems have been solved by developing solutions that are included in embodiments of the present disclosure, some examples of which are described in detail herein.

BRIEF SUMMARY

Various embodiments described herein relate to electromagnetic shielding for semiconductor packages and/or printed circuit boards.

In accordance with some embodiments of the present disclosure, an example method is provided. The method may be for manufacturing electromagnetic shielding, and the method may comprise: providing a substrate with an optical device attached and an RF can attached, wherein the RF can includes a first aperture aligned with an optical axis of the optical device; depositing a deposition layer, wherein the deposition layer includes at least a first portion of the deposition layer and a second portion of the deposition layer, wherein the first portion of the deposition layer is deposited across the first aperture of the RF can and includes a second aperture that is narrower than the first aperture and aligned with the optical axis, wherein a second portion of the deposition layer is deposited on the RF can and a first terminal of the substrate, and wherein the first portion of the deposition layer and the second portion of the deposition layer are not connected; curing the deposition layer; and wherein the cured deposition layer electrically couples to the RF can and to the first terminal of the substrate to provide a first electromagnetic shield for at least the optical device.

In accordance with some embodiments of the present disclosure, an example system is provided. The system comprises: a substrate; an optical device attached to the substrate; an RF can attached to the substrate, wherein the RF can includes a first aperture aligned with an optical axis of the optical device; a deposition layer comprising of at least a first portion of the deposition layer and a second portion of the deposition layer, wherein the first portion of the deposition layer is deposited across the first aperture of the RF can and includes a second aperture that is narrower than the first aperture and aligned with the optical axis, wherein a second portion of the deposition layer is deposited on the RF can and a first terminal of the substrate, and wherein the first portion of the deposition layer and the second portion of the deposition layer are not connected; and wherein the deposition layer was cured and electrically couples the RF can to the first terminal of the substrate to provide a first electromagnetic shield for at least the optical device.

In some embodiments, a first semiconductor package is attached to the substrate and located a first distance from the RF can; wherein the deposition layer includes a third portion deposited on the semiconductor package and at least a second terminal of the substrate; and wherein the cured deposition layer electrically couples to the second terminal of the substrate to provide a second electromagnetic shield for at least the semiconductor package.

In some embodiments, the deposition layer is comprised of a copper paste.

In some embodiments, the deposition layer is comprised of a silver paste.

In some embodiments, the deposition layer is comprised of a dielectric ink.

In some embodiments, the RF can is comprised of metal.

In some embodiments, the RF can is comprised of a non-metallic conductive material.

In some embodiments, the first portion of the deposition layer is formed in a pattern.

In some embodiments, the second portion of the deposition layer is formed as a strip.

In some embodiments, the first portion of the deposition layer is formed in first pattern and the second portion of the deposition layer is formed in a second pattern.

The above summary is provided merely for purposes of summarizing some example embodiments to provide a basic understanding of some aspects of the disclosure. Accordingly, it will be appreciated that the above-described embodiments are merely examples and should not be construed to narrow the scope or spirit of the disclosure in any way. It will also be appreciated that the scope of the disclosure encompasses many potential embodiments in addition to those here summarized, some of which will be further described below.

BRIEF SUMMARY OF THE DRAWINGS

Figure 1:
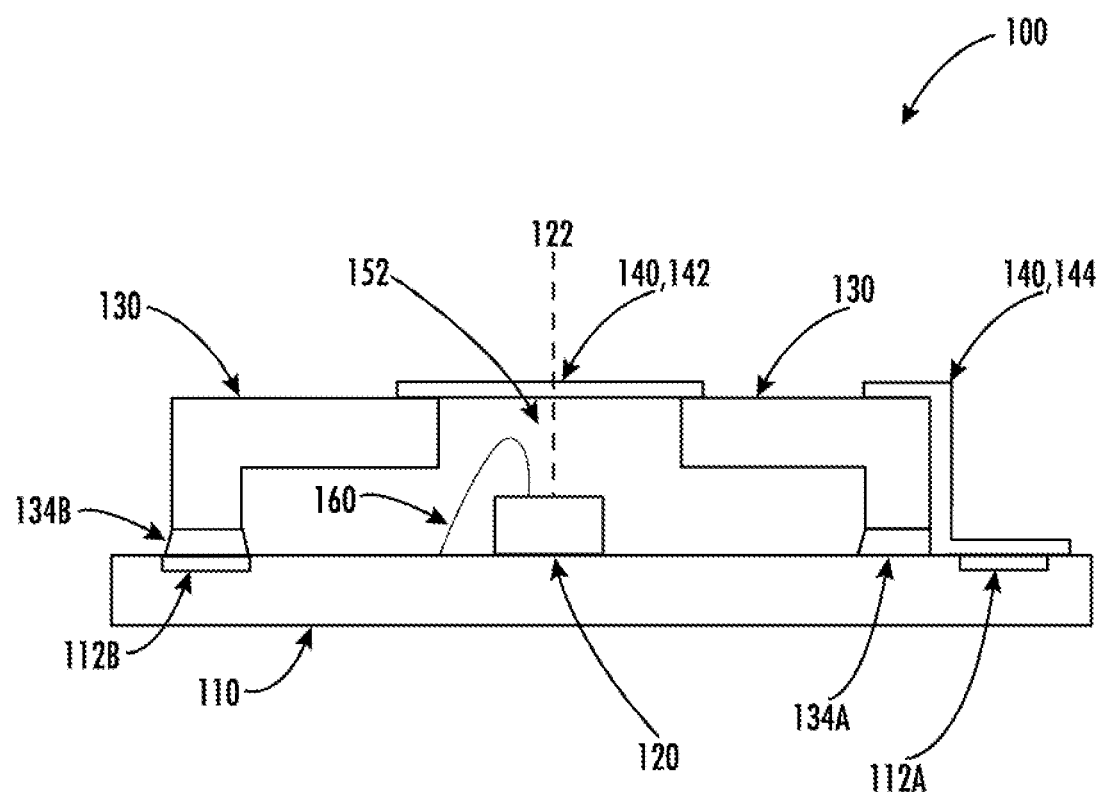
Figure 2:
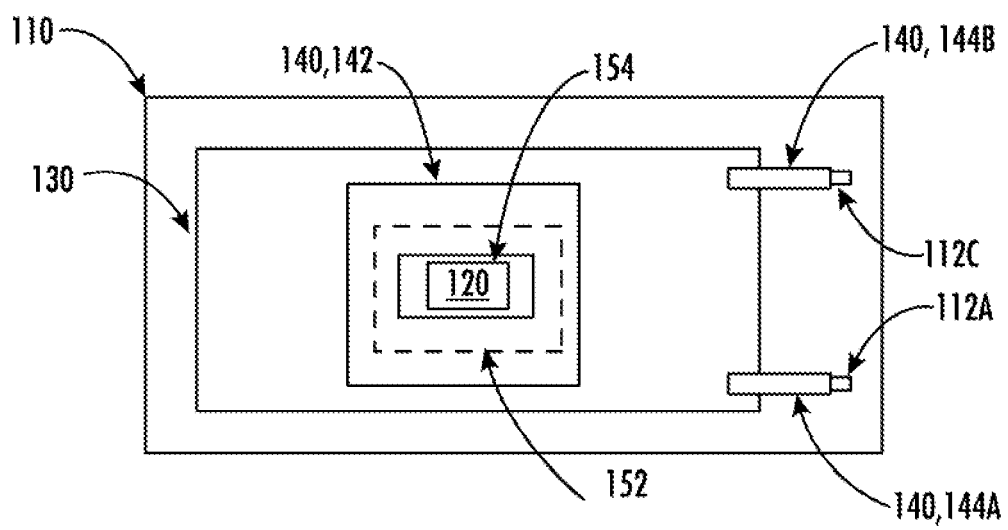
Figure 3A:
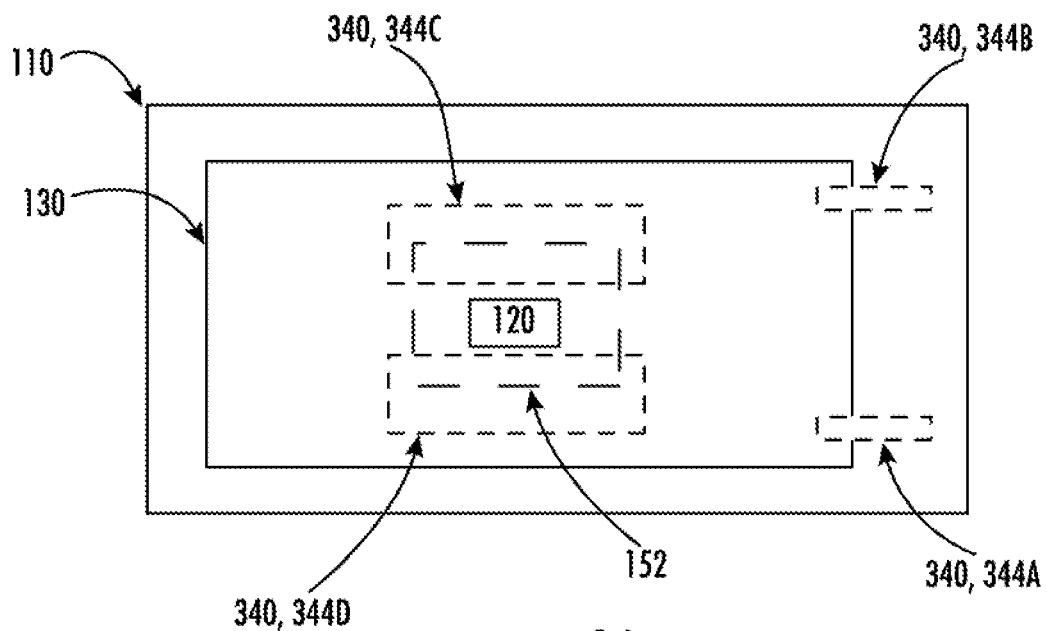
Figure 3B:
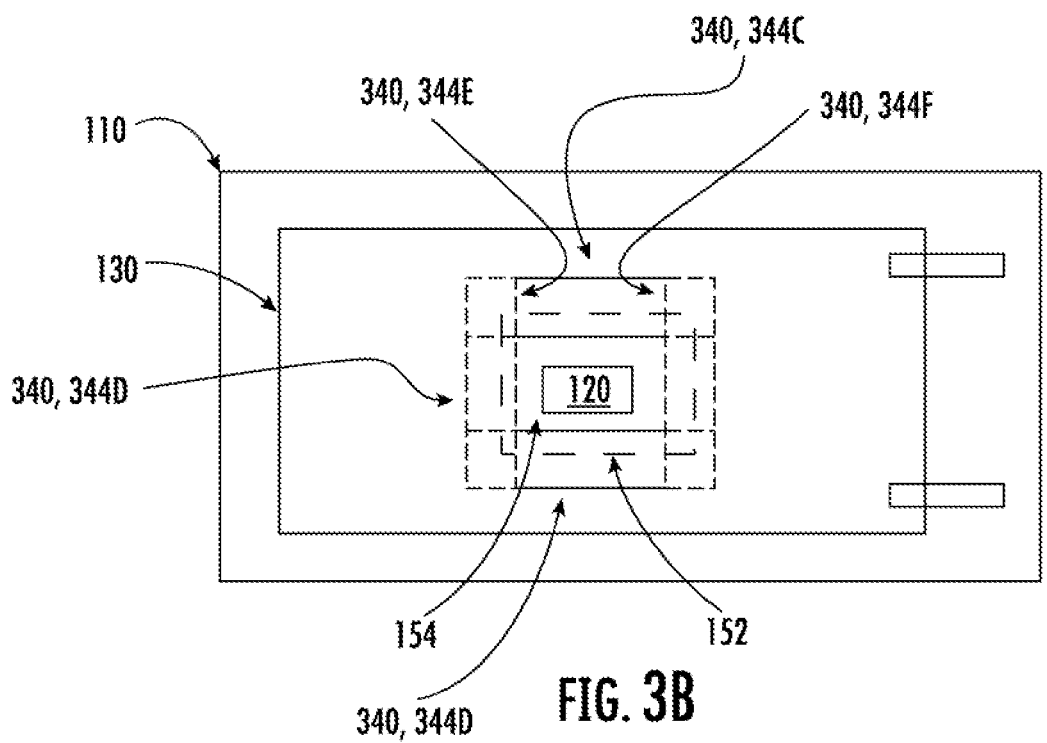
Figure 4:
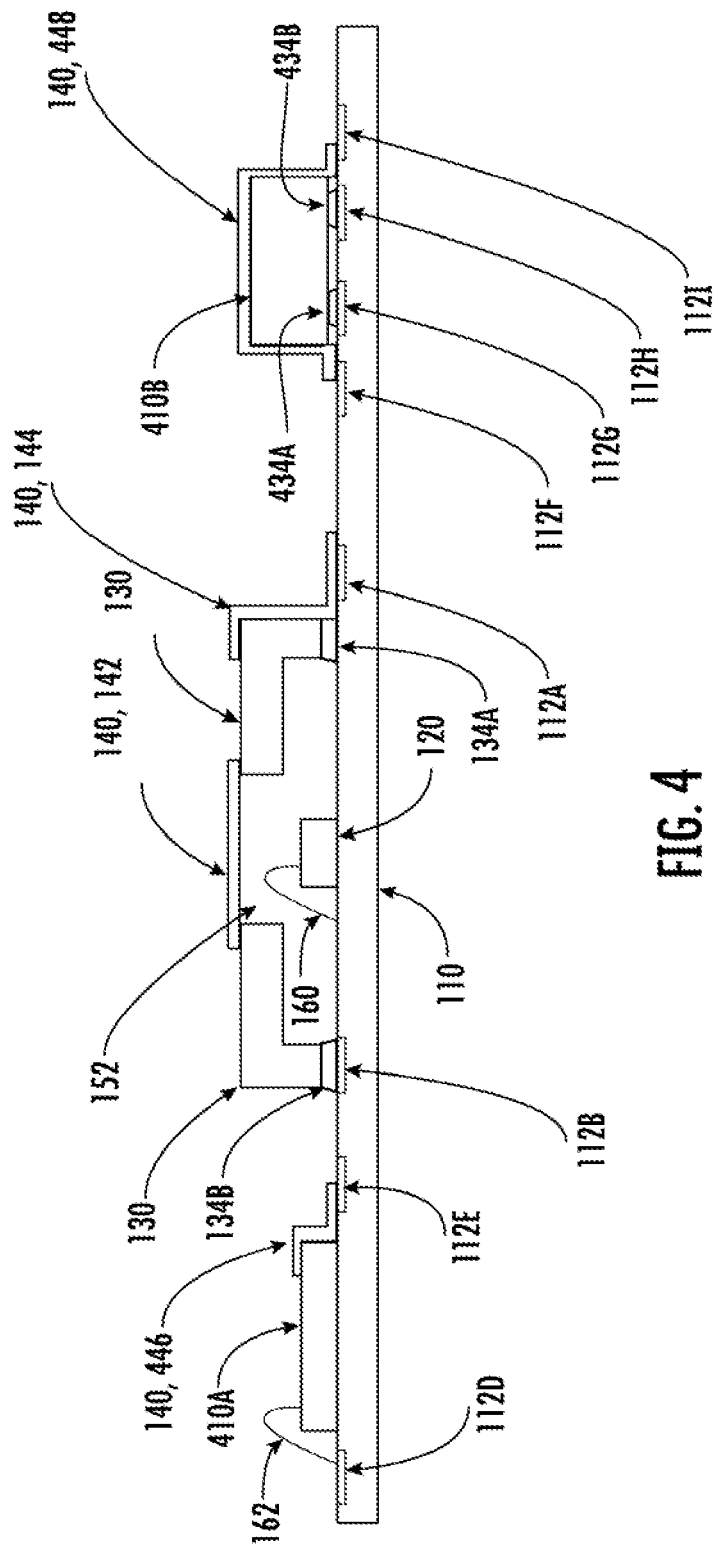
Figure 5:
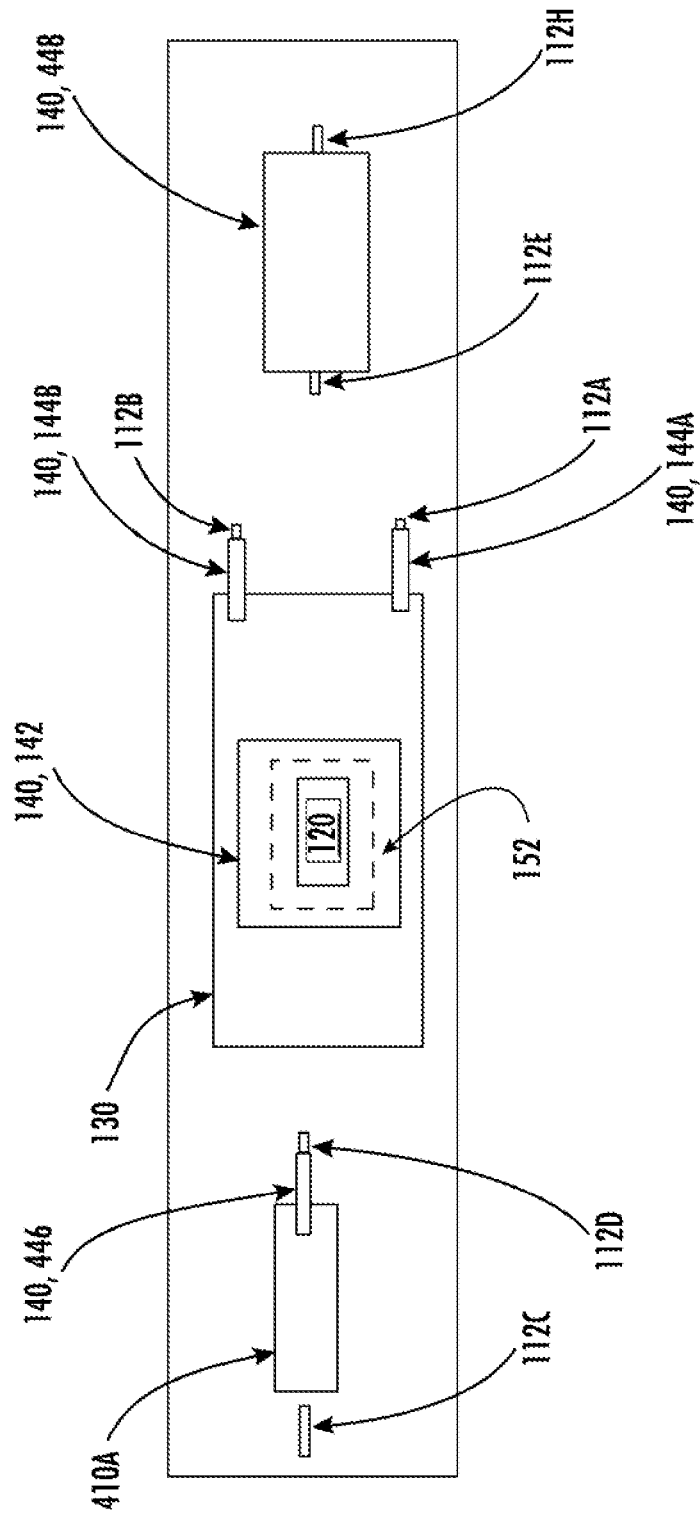
Figure 7:
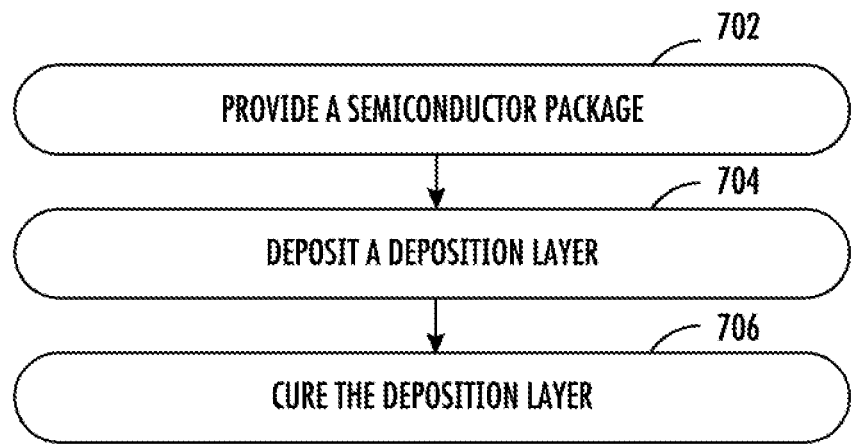
Figure 8:
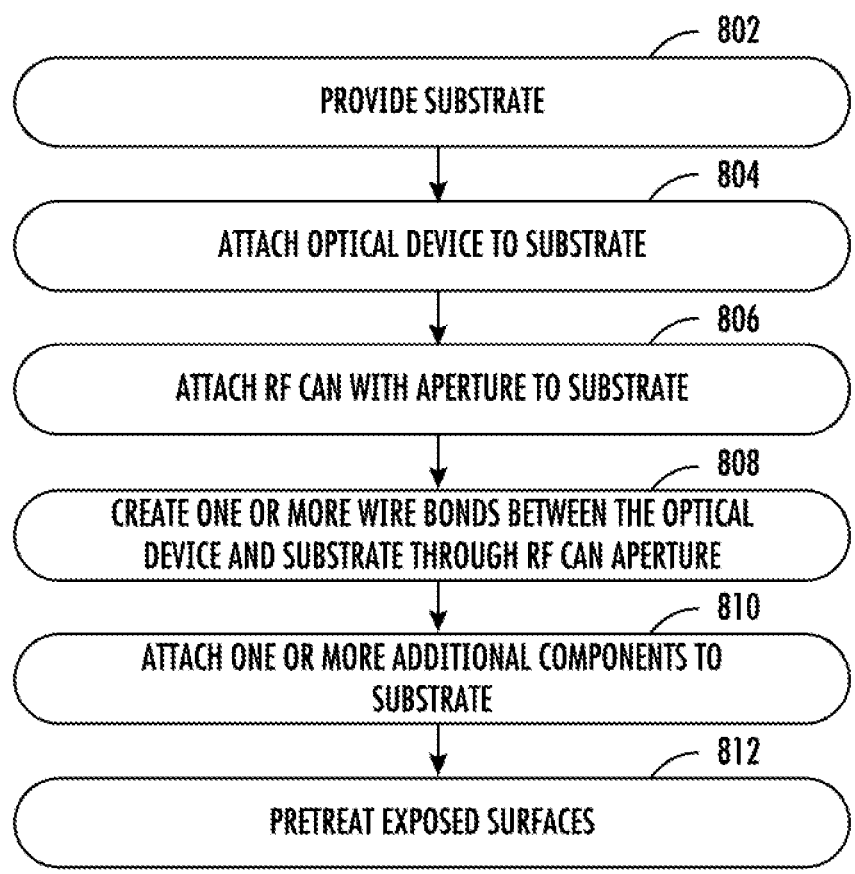

Having thus described certain example embodiments of the present disclosure in general terms, reference will now be made to the accompanying drawings, which are not necessarily drawn to scale, and wherein:

FIG. 1 illustrates a cross-section view of a block diagram of a first system in accordance with one or more embodiments of the present disclosure;

FIG. 2 illustrates a top-view of a first embodiment of the first system in accordance with one or more embodiments of the present disclosure;

FIG. 3A-3B illustrate a top-view of a second embodiment of the first system in accordance with one or more embodiments of the present disclosure;

FIG. 4 illustrates a cross-section view of a block diagram of a second system in accordance with one or more embodiments of the present disclosure;

FIG. 5 illustrates a top-view of a second embodiment of the second system in accordance with one or more embodiments of the present disclosure;

FIG. 6A-6E illustrate example embodiments of deposition layers in accordance with one or more embodiments of the present disclosure;

FIG. 7 illustrates an example flowchart of operations for manufacturing electromagnetic shielding in accordance with one or more embodiments of the present disclosure; and FIG. 8 illustrates an example flowchart of operations for providing a system in accordance with one or more embodiments of the present disclosure.

DETAILED DESCRIPTION

Some embodiments of the present disclosure will now be described more fully herein with reference to the accompanying drawings, in which some, but not all, embodiments of the disclosure are shown. Indeed, various embodiments of the disclosure may be embodied in many different forms and should not be construed as limited to the embodiments set forth herein; rather, these embodiments are provided so that this disclosure will satisfy applicable legal requirements. Like reference numerals refer to like elements throughout.

As used herein, the term "comprising" means including but not limited to and should be interpreted in the manner it is typically used in the patent context. Use of broader terms such as comprises, includes, and having should be understood to provide support for narrower terms such as consisting of, consisting essentially of, and comprised substantially of.

The phrases "in various embodiments," "in one embodiment," "according to one embodiment," "in some embodiments," and the like generally mean that the particular feature, structure, or characteristic following the phrase may be included in at least one embodiment of the present disclosure and may be included in more than one embodiment of the present disclosure (importantly, such phrases do not necessarily refer to the same embodiment).

The word "example" or "exemplary" is used herein to mean "serving as an example, instance, or illustration." Any implementation described herein as "exemplary" is not necessarily to be construed as preferred or advantageous over other implementations.

If the specification states a component or feature "may," "can," "could," "should," "would," "preferably," "possibly," "typically," "optionally," "for example," "often," or "might" (or other such language) be included or have a characteristic, that a specific component or feature is not required to be included or to have the characteristic. Such a component or feature may be optionally included in some embodiments or it may be excluded.

The use of the term "circuitry" as used herein with respect to components of a system or an apparatus should be understood to include particular hardware configured to perform the functions associated with the particular circuitry as described herein. The term "circuitry" should be understood broadly to include hardware and, in some embodiments, software for configuring the hardware. For example, in some embodiments, "circuitry" may include processing circuitry, communications circuitry, input/output circuitry, and the like. In some embodiments, other elements may provide or supplement the functionality of particular circuitry.

Overview

Various embodiments of the present disclosure are directed to improved methods, systems, and apparatus for electromagnetic shielding, particularly for semiconductor package level devise and/or printed circuit board package level devices.

Various semiconductor devices and/or PCB components may require a shield or shielding to prevent electromagnetic interference (EMI) from interfering with their operation and/or operating inefficiently. Such EMI may come from other components and/or devices, including components and/or devices located on the same PCB. The shielding prevents EMI from sources outside the shielding from interfering with what is inside the shielding, including preventing cross talk between components on a PCB and/or substrate.

Radiofrequency (RF) cans may be used to shield devices and/or components inside an RF can from EMI from sources external to the RF can. An RF can may shield an optical device (e.g., a laser, an image sensor, or the like). However an optical device requires an aperture in an RF can for an optical path in order to perform the optical device's intended function. Such an aperture decreases the shielding provided by the RF can based to the size of the aperture in the RF can. The aperture in the RF can is sized larger than needed for the optical path due to one or more operations performed through the RF can aperture, such as to electrically couple the optical device to one or more terminals on the substrate with one or more wire bonds. Additionally or alternatively, some components may utilize shielding from a conformal coating, but such a coating is applied with non-selective operations (e.g., sputtering, spraying, or plating) which requires multiple steps and an exposed ground plane. Various embodiments may incorporate these alternative manner of EMI shielding, including them being used in conjunction the EMI shielding in accordance with one or more embodiments described herein.

In accordance with embodiments described herein, various embodiments may utilize a shield formed from a deposition layer. The deposition layer may be applied in one or more operations that selectively deposit the deposition layer. The deposition layer does not require a mask or associated operations, which allows for greater efficiency in manufacturing. A deposition layer may be selectively applied in one or more portions to one or more components of a semiconductor package, PCB, and/or components on a PCB. The deposition layer may be comprised of a paste. In various embodiments, the depositing of the portions may be comprised of plurality of strips and/or patches deposited at selective locations at the same time. In various embodiments this may be referred to as impulse printing.

The deposition layer of various embodiments may include one or more portions that bridges and/or spans gaps and/or openings in and/or between semiconductor packages, PCBs, and/or components on PCBs. The deposition layer may also wrap around and/or be applied to multiple sides of a semiconductor packages and/or components on a PCB, including around edges. Additionally or alternatively, multiple deposits of the deposition layer may be used to apply a plurality of strips that overlap with another deposition layer, including without needing to apply any masks or other layers (e.g., laminates, films, etc.).

It should be readily appreciated that the embodiments of the methods, systems, and apparatuses described herein may be configured in various additional and alternative manners in addition to those expressly described herein.

Exemplary Systems and Apparatuses

Embodiments of the present disclosure herein include systems and apparatuses for electromagnetic shielding described herein may be implemented in various embodiments.

FIG. 1 illustrates a cross-section view of a block diagram of a first system in accordance with one or more embodiments of the present disclosure. The first semiconductor package includes a substrate 110 with an optical device 120 attached to the substrate. The optical device may be, for example, a laser (e.g., LCSP, VCSEL, etc.) or optical sensor. The optical sensor 120 may be electrically coupled via one or more wire bonds 160 to one or more terminals or signal pads on the substrate 110. An RF can 130 is attached to the substrate 110 with one or more attach layer 134 (e.g., glue, epoxy, paste, or the like). The RF can 130 may be aligned so that an aperture 152 of the RF can 130 is aligned with an optical axis 122 of the optical sensor 120. Thus the optical device 120 may emit and/or receive light along its optical path. In various embodiments, the aperture 150 may be larger than the optical path and/or sized to allow for the optical sensor to be installed and/or attached (e.g., via wire bond 160) to the substrate 110 after attachment of the RF can 130 to the substrate 110. A deposition layer 140 of may include a first portion 142 with an aperture 154 (e.g., as illustrated in FIG. 2) that narrows the RF can aperture 152 and/or a second portion 144 that electrically couples the RF can to a terminal 112A on the substrate 110.

The RF can 130 may provide some EMI shielding but the aperture 152 in the RF can 130 may fail to provide shielding for that portion of the RF can 130. The RF can 130 may, however, act as a conductor that will conduct signals generated by EMI shielded in the deposition layer 140 to one or more grounds, such as through the RF can 130, through the second portion 144 of the deposition layer 140, and to the terminal 112A that may be grounded.

In various embodiments, the RF can may be electrically coupled to one or more terminals 112 on the substrate 110. For example, the RF can 130 may be electrically coupled to terminal 112B through attach layer 134B. The terminal 112B may be configured as a ground plane or to be electrically coupled to a ground plane of a larger system. Alternatively, the RF can 130 may be attached to the substrate 110 at one or more attach layer 134 that are not electrically coupled to a ground. For example, RF can 130 may be attached to substrate 110 at attach layer 134A, which is not electrically coupled to a terminal 112 of the substrate. A terminal 112 may, however, be located on the substrate 110 near the RF can 130, such as with terminal 112A.

In various embodiments, the substrate 110, RF can 130, and/or other components, systems, and/or circuitries on the substrate 110 may have a pretreatment applied (e.g., a plasma treatment) to improve coupling with the deposition layer 140.

FIG. 2 illustrates a top-view of a first embodiment of the first semiconductor package in accordance with one or more embodiments of the present disclosure. As illustrated in FIG. 2, an aperture of the first portion 142 of the deposition layer 140 may include an aperture 154 of the first portion 142 of the deposition layer 140. The aperture 154 of the first portion 142 may be narrower than the aperture 152 of the RF can 130.

The deposition layer 140 may be a paste and/or an ink. In various embodiments, the paste may be an epoxy and/or ink, such as a dielectric ink. The paste may also be a metallic paste (e.g., comprised of copper, silver, etc.). After being deposited, the deposition layer 140 may be cured (e.g., sintering or the like). When the deposition layer 140 is deposited onto the RF can 130 and/or substrate 110, the deposition layer 140 may electrically couple to the RF can 130 and/or substrate 110, including one or more terminals 112 of the substrate 110. Thus the deposition layer may be used to shield the optical sensor 120 from EMI.

FIG. 3A-3B illustrate a top-view of a second embodiment of the first system in accordance with one or more embodiments of the present disclosure. The deposition layer 340 may be applied with multiple depositions. For example a first deposition may deposit a plurality of strips 344A-D of FIG. 3A. A second deposition may deposit a second plurality of strips 344E, 344F. The deposition layer comprised of strips 344C, 344D, 344E, and 344F may form a pattern around an aperture 152. The pattern of these strips 344C-344F may form an aperture 154 that may narrow the aperture 152. As will be appreciated, the strips 344C-344F cover one or more portions of the aperture 152 where the strips 344C-344F are unsupported by the RF can 130. Additionally, the strips 344A, and 344B may be deposited with the first deposition layer. The strips 344A, 344B may electrically couple the RF can to one or more terminals in the substrate 110.

FIG. 4 illustrates a cross-section view of a block diagram of a second system in accordance with one or more embodiments of the present disclosure. The second system includes the first system on the substrate 110 along with a plurality of additional components on the substrate 110. The components may include a sensor 410A, a semiconductor package 410B (e.g., a WLSCP or the like) and/or other package or PCB level components and/or circuitries. The sensor 410A may be electrically coupled to one or more terminals (e.g., 112D) on the substrate 110 by one or more wire bonds 162. The semiconductor package 410B may be electrically coupled to one or more terminals 112 (e.g., 112G, 112H) of the substrate 110 by one or more terminals of the semiconductor package (e.g., 434A, 434B).

An electrical connection may be provided for the sensor 410A by a third portion 446 of the deposition layer 140. For example, a third portion 446 may be deposited to attached to the sensor 410A, including a terminal, and a terminal 112D of the substrate 110.

Additionally or alternatively, semiconductor package 410B may lack all or in part EMI shielding. Shielding may be provided with a deposition layer 140 at the same time as other portions of the deposition layer 140 are applied. For example, shielding for the semiconductor package 410B may be provided with a fourth portion 448 of deposition layer 140. The fourth portion 448 of the deposition layer 140 may entirely cover a semiconductor package 410B. The fourth portion 448 of the deposition layer 140 may be electrically coupled to one or more terminals 112 of the substrate 110 (e.g., 112E for the third portion and 112F and 112I for the fourth portion) to ground the deposition layer 140 and provide a path for EMI absorbed to go to ground.

FIG. 5 illustrates a top-view of a second embodiment of the first system in accordance with one or more embodiments of the present disclosure. The top-view illustrates how the third portion 448 may be a strip that electrically coupled one or more terminals of a sensor 410A to one or more terminals 112 of the substrate 110. It also illustrates how the fourth portion 448 may be entirely cover the semiconductor package 410B.

FIG. 6A-6E illustrate example embodiments of deposition layers in accordance with one or more embodiments of the present disclosure. The deposition layer 140 comprises a layer of paste that may be deposited in a plurality of locations at the same time. The plurality of locations of the deposition layer do not need to be connected. Thus the deposition layer 140 may be comprised of multiple portions (e.g., 142, 144) that are separately located. Additionally, each portion of the deposition layer 140 may be shape the same, similarly, or differently. FIGS. 6A-6E illustrated different embodiments that a portion of the deposition layer 140 may take. However it will be appreciated that the deposition layer 140 may take other shapes and/or patterns in addition to those illustrated in FIGS. 6A-6E.

Figure 6A:
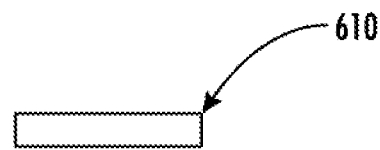

FIG. 6A illustrates a top-view of a strip of deposition layer 140. The strip 610 may have a height and a length.

Figure 6B:
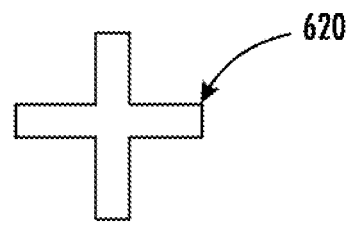

FIG. 6B illustrates a top-view of a first pattern of deposition layer 140. The first pattern 610 of a cross may have a first height and a first width.

Figure 6C:
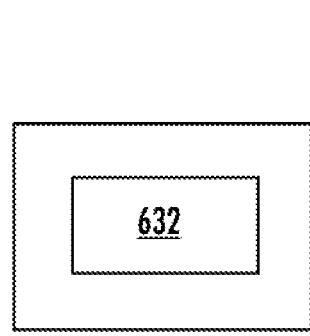

FIG. 6C illustrates a second pattern of deposition layer 140. The second pattern 630 is of a patch or strip that has an aperture 632.

Figure 6D:
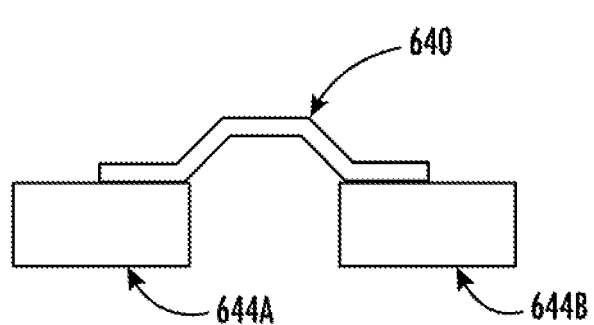

FIG. 6D illustrates a cross-section view of a strip for deposition layer 140. The strip 640 may have a height that allows the strip 640 to have a 3D structure. The strip 640 may span a gap and/or aperture create between a first side 644A and a second side 644B. For example, the strip 640 may have height and span an aperture of an RF can (e.g., 130), which may be a bridge structure.

Figure 6E:
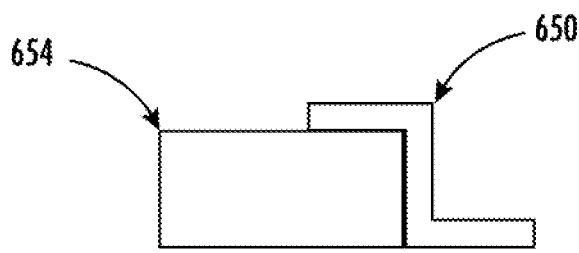

FIG. 6E illustrates a cross-section view of a strip of deposition layer 140. The strip 650 may be deposited at the same time to attach to one or more surfaces, such as the side and top surfaces of a component (e.g., 654). Alternatively or additionally, the strip 650 may attach around corners and/or edges of a component (e.g., 654).

In various embodiments, a deposition layer 140 may have a 3D shape and/or structure, which may include complex 3D shapes with air gaps, steps, and/or openings.

It should be readily appreciated that the embodiments of the systems and apparatuses, described herein may be configured in various additional and alternative manners in addition to those expressly described herein.

Exemplary Methods

FIG. 7 illustrates an example flowchart of operations for manufacturing electromagnetic shielding in accordance with one or more embodiments of the present disclosure.

At operation 702, a system is provided. The system may include a substrate 110 with an optical device 120 attached and an RF can 130 attached. The optical device 120 may have an optical axis 122 that aligned with an aperture 152 of the RF can 130.

At operation 704, a deposition layer is deposited. The deposition layer 140 may be deposited in one or more portions (e.g., 142, 144, etc.). The one or more portions may include a first portion 142 that is deposited in a pattern that partially covers an aperture 152 of an RF can 130. The first portion 142 may include an aperture 154 that is narrower than the aperture 152 of the RF can 130. The optical axis 122 of the optical device 120 may also be aligned with the aperture 154 of the first portion 142 of the deposition layer 142. The deposition layer 140 may also include one or more additional portions 144 deposited at the same time as the first portion 142. The second portion 144 may electrically couple the RF can 130 to one or more terminals 112A of substrate 110, which may be grounded or be configured to be grounded.

At operation 706, the deposition is cured. The deposition layer 140 may be cured, such as by sintering the deposition layer 140. Curing the deposition layer 140 may cure a paste of the deposition layer 140 into a fixed position by stiffening via sintering.

FIG. 8 illustrates an example flowchart of operations for providing a system in accordance with one or more embodiments of the present disclosure.

At operation 802, a substrate is provided. A substrate may be substrate 110.

At operation 804, an optical device is attached to the substrate. An optical device 120 may be attached to the substrate 110. The optical device 120 may be attached with a die attach.

At operation 806, an RF can with an aperture is attached to the substrate. An RF can 130 with an aperture 154 may be attached to the substrate 110. The aperture 154 of the RF can 130 may be aligned with an optical axis 122 of the optical device 120 to allow the optical device 120 to emit and/or receive light. The RF can 130 may be attached with a surface mount technology.

At operation 808, one or more wire bonds is created between the optical device and the substrate through the aperture of the RF can. One or more wire bonds 160 may be created to electrically couple one or more terminals and/or signal pads of the optical device 120 to one or more terminals and/or signal pads of the substrate 110. The wire bonds may be created through the aperture 152 of the RF can 130.

At operation 810, one or more additional components is attached to the substrate. One or more additional components, such as a sensor 410A, a semiconductor package, or the like, may be attached to the substrate 110.

At operation 812, exposed surfaces are pretreated. One or more exposed surfaces of the substrate 110, RF can 130, sensor 410A, semiconductor package 410B, and/or other attached components may be pretreated, such as with a plasma treatment or the like.

Various embodiments may omit one or more operations described herein. Additionally or alternatively, various embodiments may iterate one or more operations described herein.

Conclusion

Operations and/or functions of the present disclosure have been described herein, such as in flowcharts. While operations and/or functions are illustrated in the drawings in a particular order, this should not be understood as requiring that such operations and/or functions be performed in the particular order shown or in sequential order, or that all illustrated operations be performed, to achieve desirable results. In certain circumstances, operations and/or functions in alternative ordering may be advantageous. In some cases, the actions recited in the claims may be performed in a different order and still achieve desirable results. Thus, while particular embodiments of the subject matter have been described, other embodiments are within the scope of the following claims.

While this specification contains many specific embodiment and implementation details, these should not be construed as limitations on the scope of any disclosures or of what may be claimed, but rather as descriptions of features specific to particular embodiments of particular disclosures. Certain features that are described herein in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are illustrated in the drawings in a particular order, this should not be understood as requiring that such operations be performed in the particular order shown or in sequential order, or that all illustrated operations be performed, to achieve desirable results. In certain circumstances, operations in alternative ordering may be advantageous. In some cases, the actions recited in the claims may be performed in a different order and still achieve desirable results.

While this detailed description has set forth some embodiments of the present invention, the appended claims cover other embodiments of the present invention which differ from the described embodiments according to various modifications and improvements.

Within the appended claims, unless the specific term "means for" or "step for" is used within a given claim, it is not intended that the claim be interpreted under 35 U.S.C. § 112, paragraph 6.

The invention claimed is:

1. A method for manufacturing electromagnetic shielding comprising:
    providing a substrate with an optical device attached and an RF can attached, wherein the RF can includes a first aperture aligned with an optical axis of the optical device;
    depositing a deposition layer, wherein the deposition layer includes at least a first portion of the deposition layer and a second portion of the deposition layer, wherein the first portion of the deposition layer is deposited across the first aperture of the RF can and includes a second aperture that is narrower than the first aperture and aligned with the optical axis, wherein a second portion of the deposition layer is deposited on the RF can and a first terminal of the substrate, and wherein the first portion of the deposition layer and the second portion of the deposition layer are not connected;
    curing the deposition layer; and
    wherein the cured deposition layer electrically couples to the RF can and to the first terminal of the substrate to provide a first electromagnetic shield for at least the optical device.

2. The method for manufacturing electromagnetic shielding of claim 1, wherein a first semiconductor package is attached to the substrate and located a first distance from the RF can; wherein the deposition layer includes a third portion deposited on the semiconductor package and at least a second terminal of the substrate; and wherein the cured deposition layer electrically couples to the second terminal of the substrate to provide a second electromagnetic shield for at least the semiconductor package.

3. The method for manufacturing electromagnetic shielding of claim 1, wherein the deposition layer is comprised of a copper paste.

4. The method for manufacturing electromagnetic shielding of claim 1, wherein the deposition layer is comprised of a silver paste.

5. The method for manufacturing electromagnetic shielding of claim 1, wherein the deposition layer is comprised of a dielectric ink.

6. The method for manufacturing electromagnetic shielding of claim 1, wherein RF can is comprised of metal.

7. The method for manufacturing electromagnetic shielding of claim 1, wherein the RF can is comprised of a non-metallic conductive material.

8. The method for manufacturing electromagnetic shielding of claim 1, wherein the first portion of the deposition layer is formed in a pattern.

9. The method for manufacturing electromagnetic shielding of claim 1, wherein the second portion of the deposition layer is formed as a strip.

10. The method for manufacturing electromagnetic shielding of claim 1, wherein the first portion of the deposition layer is formed in first pattern and the second portion of the deposition layer is formed in a second pattern.

11. A system comprising:
    a substrate;
    an optical device attached to the substrate;
    an RF can attached to the substrate, wherein the RF can includes a first aperture aligned with an optical axis of the optical device;
    a deposition layer comprising of at least a first portion of the deposition layer and a second portion of the deposition layer, wherein the first portion of the deposition layer is deposited across the first aperture of the RF can and includes a second aperture that is narrower than the first aperture and aligned with the optical axis, wherein a second portion of the deposition layer is deposited on the RF can and a first terminal of the substrate, and wherein the first portion of the deposition layer and the second portion of the deposition layer are not connected; and
    wherein the deposition layer was cured and electrically couples the RF can to the first terminal of the substrate to provide a first electromagnetic shield for at least the optical device.

12. The system of claim 11, wherein a first semiconductor package is attached to the substrate and located a first distance from the RF can; wherein the deposition layer includes a third portion deposited on the semiconductor package and at least a second terminal of the substrate; and wherein the cured deposition layer electrically couples to the second terminal of the substrate to provide a second electromagnetic shield for at least the semiconductor package.

13. The system of claim 11, wherein the deposition layer is comprised of a copper paste.

14. The system of claim 11, wherein the deposition layer is comprised of a silver paste.

15. The system of claim 11, wherein the deposition layer is comprised of a dielectric ink.

16. The system of claim 11, wherein the RF can is comprised of metal.

17. The system of claim 11, wherein the RF can is comprised of a non-metallic dielectric material.

18. The system of claim 11, wherein the first portion of the deposition layer is formed in a pattern.

19. The system of claim 11, wherein the second portion of the deposition layer is formed as a strip.

20. The system of claim 11, wherein the first portion of the deposition layer is formed in first pattern and the second portion of the deposition layer is formed in a second pattern.

* * * * *